(12) United States Patent
Kao et al.

(10) Patent No.: US 10,804,374 B2
(45) Date of Patent: *Oct. 13, 2020

(54) SPACER STRUCTURE WITH HIGH PLASMA RESISTANCE FOR SEMICONDUCTOR DEVICES

(71) Applicant: Taiwan Semiconductor Manufacturing Co., Ltd., Hsinchu (TW)

(72) Inventors: Wan-Yi Kao, Baoshan Township (TW); Chung-Chi Ko, Nantou (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/722,160

(22) Filed: Dec. 20, 2019

(65) Prior Publication Data

US 2020/0127112 A1 Apr. 23, 2020

Related U.S. Application Data

(63) Continuation of application No. 16/575,974, filed on Sep. 19, 2019, now Pat. No. 10,516,036, which is a
(Continued)

(51) Int. Cl.
*H01L 29/66* (2006.01)
*H01L 29/10* (2006.01)
(Continued)

(52) U.S. Cl.
CPC .... *H01L 29/6656* (2013.01); *H01L 21/28132* (2013.01); *H01L 21/823431* (2013.01);
(Continued)

(58) Field of Classification Search
CPC ............ H01L 29/6656; H01L 29/1033; H01L 29/66719; H01L 21/823431;
(Continued)

(56) References Cited

U.S. PATENT DOCUMENTS 8,637,384 B2  1/2014  Ando et al.
8,962,400 B2  2/2015  Tsai et al.
(Continued)

FOREIGN PATENT DOCUMENTS

KR  20130086272 A  8/2013
KR  20150126765 A  11/2015
TW  201712866 A  4/2017

*Primary Examiner* — John P. Dulka
(74) *Attorney, Agent, or Firm* — Slater Matsil, LLP

(57) ABSTRACT

Semiconductor device structures comprising a spacer feature having multiple spacer layers are provided. In one example, a semiconductor device includes an active area on a substrate, the active area comprising a source/drain region, a gate structure over the active area, the source/drain region being proximate the gate structure, a spacer feature having a first portion along a sidewall of the gate structure and having a second portion along the source/drain region, wherein the first portion of the spacer feature comprises a bulk spacer layer along the sidewall of the gate structure, wherein the second portion of the spacer feature comprises the bulk spacer layer and a treated seal spacer layer, the treated seal spacer layer being disposed along the source/drain region and between the bulk spacer layer and the source/drain region, and a contact etching stop layer on the spacer feature.

20 Claims, 16 Drawing Sheets

Related U.S. Application Data continuation of application No. 15/874,278, filed on Jan. 18, 2018, now Pat. No. 10,483,372.

(60) Provisional application No. 62/565,848, filed on Sep. 29, 2017.

(51) Int. Cl.
    *H01L 29/165*     (2006.01)
    *H01L 21/28*     (2006.01)
    *H01L 29/08*     (2006.01)
    *H01L 29/78*     (2006.01)
    *H01L 21/8234*     (2006.01)

(52) U.S. Cl.
    CPC ...... *H01L 29/0847* (2013.01); *H01L 29/1033* (2013.01); *H01L 29/165* (2013.01); *H01L 29/66545* (2013.01); *H01L 29/66553* (2013.01); *H01L 29/66719* (2013.01); *H01L 29/66795* (2013.01); *H01L 29/785* (2013.01)

(58) Field of Classification Search
    CPC ......... H01L 21/28132; H01L 29/66795; H01L 29/0847; H01L 29/165; H01L 29/66553; H01L 29/785; H01L 29/66545
    See application file for complete search history.

(56) References Cited

U.S. PATENT DOCUMENTS

| | | | |
|---|---|---|---|
| 9,093,514 | B2 | 7/2015 | Tsai et al. |
| 9,190,486 | B2 | 11/2015 | Xie et al. |
| 9,236,267 | B2 | 1/2016 | De et al. |
| 9,245,805 | B2 | 1/2016 | Yeh et al. |
| 9,337,094 | B1 | 5/2016 | Pranatharthiharan et al. |
| 9,418,897 | B1 | 8/2016 | Ching et al. |
| 9,520,482 | B1 | 12/2016 | Chang et al. |
| 9,576,814 | B2 | 2/2017 | Wu et al. |
| 9,608,116 | B2 | 3/2017 | Ching et al. |
| 9,812,363 | B1 | 11/2017 | Liao et al. |
| 9,859,380 | B2 | 1/2018 | Lee et al. |
| 9,911,824 | B2 | 3/2018 | Ching et al. |
| 10,008,578 | B1 | 6/2018 | Lee et al. |
| 10,516,036 | B1 * | 12/2019 | Kao ................. H01L 21/823828 |
| 2002/0163036 | A1 | 11/2002 | Miura et al. |
| 2009/0001480 | A1 | 1/2009 | Cheng |
| 2010/0155776 | A1 | 6/2010 | Lee |
| 2011/0121398 | A1 | 5/2011 | Hoentschel et al. |
| 2014/0110798 | A1 | 4/2014 | Cai et al. |
| 2014/0264491 | A1 | 9/2014 | Huang et al. |
| 2015/0091089 | A1 | 4/2015 | Niebojewski et al. |
| 2015/0145066 | A1 | 5/2015 | Lu et al. |
| 2015/0263122 | A1 | 9/2015 | Hsiao et al. |
| 2016/0013185 | A1 | 1/2016 | Greene et al. |
| 2016/0020301 | A1 | 1/2016 | Park et al. |
| 2016/0093726 | A1 | 3/2016 | Ching et al. |
| 2016/0148933 | A1 | 5/2016 | Cheng et al. |
| 2016/0163816 | A1 | 6/2016 | Yu et al. |
| 2016/0181143 | A1 | 6/2016 | Kwon et al. |
| 2016/0225667 | A1 | 8/2016 | Zang |
| 2017/0200718 | A1 | 7/2017 | Choi et al. |
| 2017/0222008 | A1 * | 8/2017 | Hsu .................... H01L 21/76849 |
| 2017/0222014 | A1 | 8/2017 | Tak et al. |
| 2017/0243869 | A1 | 8/2017 | Chang et al. |
| 2017/0271476 | A1 | 9/2017 | Jang et al. |
| 2017/0352659 | A1 | 12/2017 | Basker et al. |
| 2018/0151683 | A1 * | 5/2018 | Yeo ................. H01L 21/823425 |
| 2018/0190504 | A1 * | 7/2018 | Lee ..................... H01L 29/7853 |
| 2018/0233417 | A1 | 8/2018 | Pranatharthiharan et al. |
| 2018/0286981 | A1 | 10/2018 | Jang et al. |
| 2018/0301371 | A1 | 10/2018 | Wang et al. |
| 2018/0350625 | A1 * | 12/2018 | Chao ................... H01L 29/7848 |
| 2019/0006506 | A1 | 1/2019 | Greene et al. |
| 2019/0027473 | A1 | 1/2019 | Chen et al. |
| 2019/0035694 | A1 | 1/2019 | More et al. |
| 2019/0051748 | A1 | 2/2019 | Balakrishnan et al. |
| 2019/0067013 | A1 | 2/2019 | Wang et al. |
| 2019/0067112 | A1 | 2/2019 | Liang et al. |
| 2019/0067442 | A1 | 2/2019 | Lin et al. |
| 2019/0123175 | A1 | 4/2019 | Hsu et al. |
| 2019/0157393 | A1 | 5/2019 | Roberts et al. |
| 2019/0164766 | A1 * | 5/2019 | Huang .................. H01L 29/785 |
| 2019/0172927 | A1 | 6/2019 | Jagannathan et al. |
| 2019/0259854 | A1 | 8/2019 | Jagannathan et al. |
| 2019/0312143 | A1 | 10/2019 | Lin et al. |

* cited by examiner

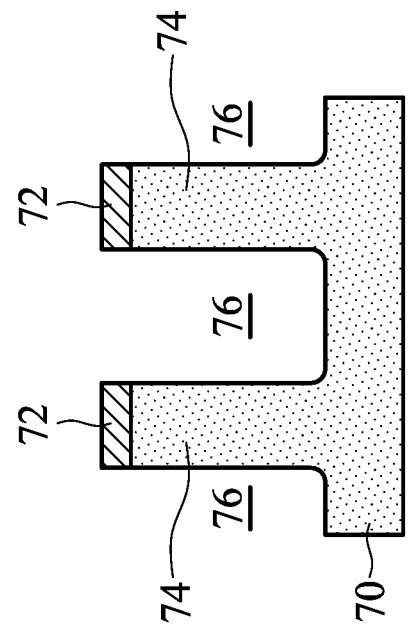
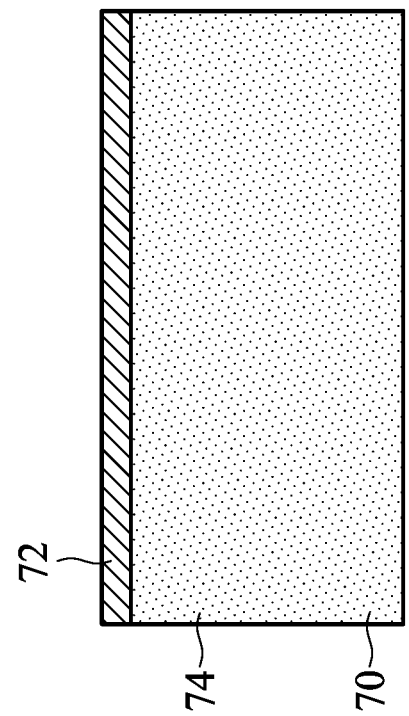
FIG. 4A
FIG. 4B

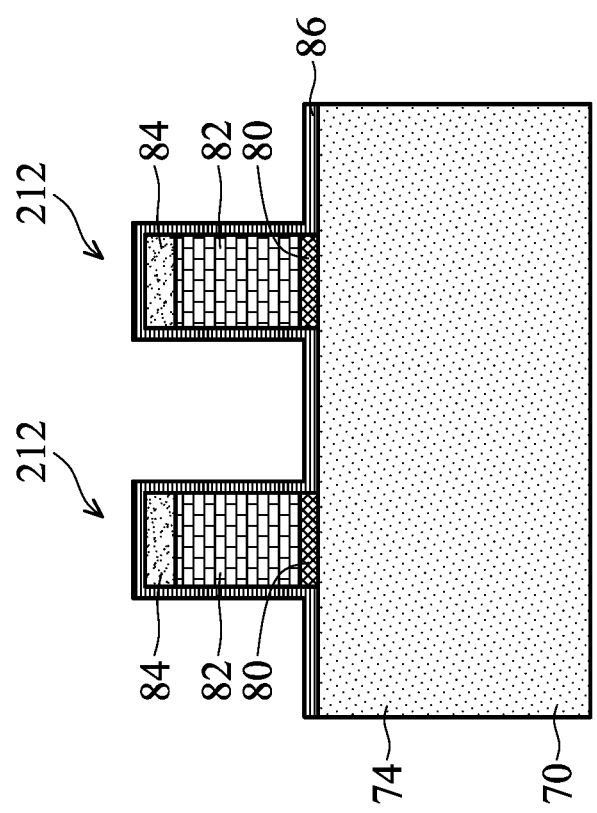
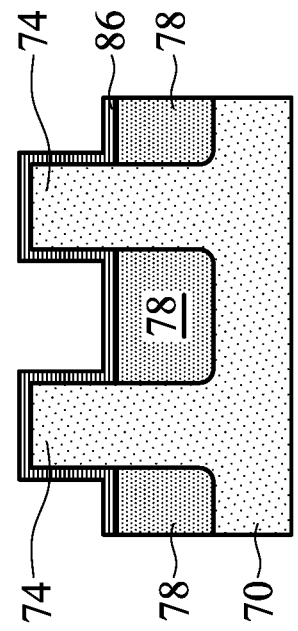
FIG. 7A
FIG. 7B

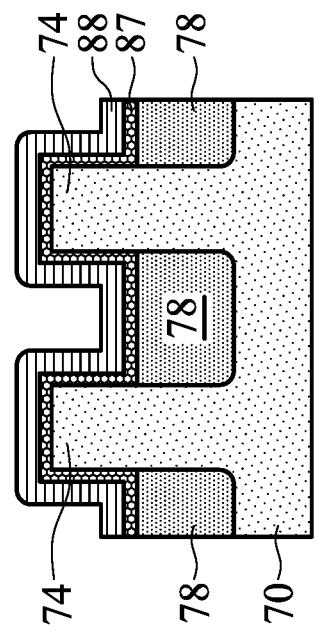
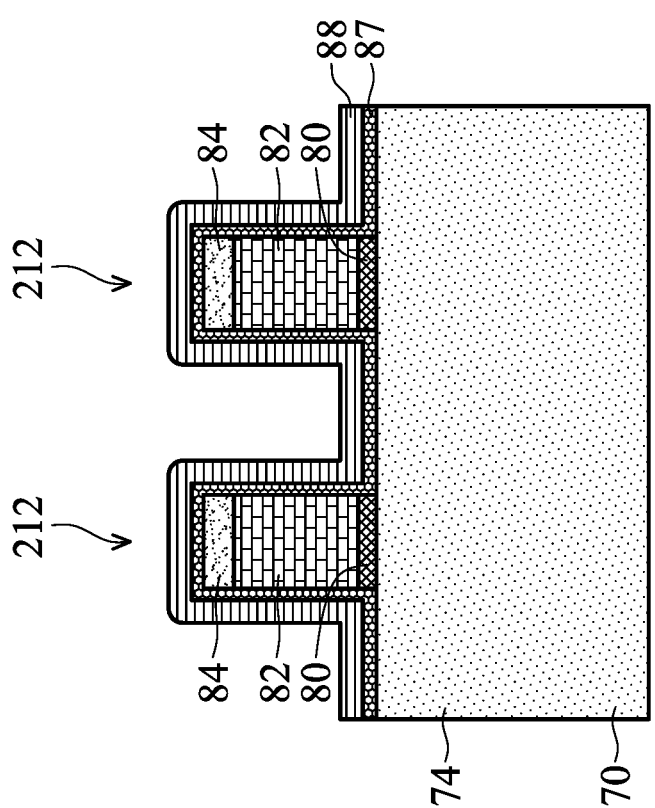
FIG. 9B
FIG. 9A

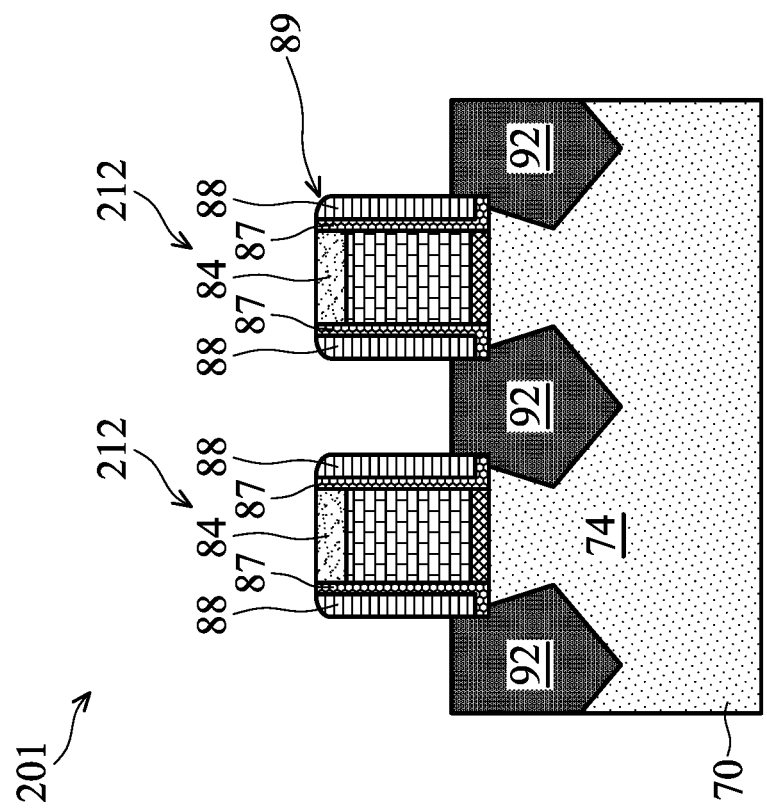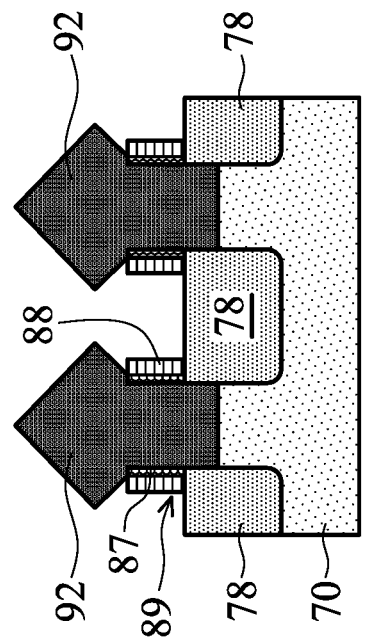
FIG. 12A
FIG. 12B

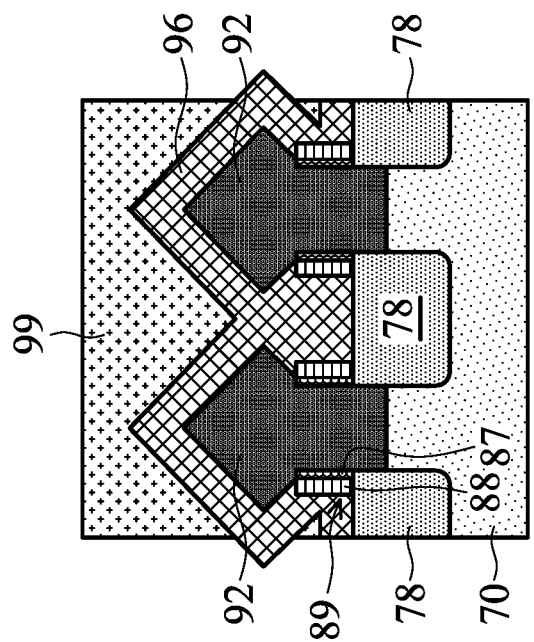
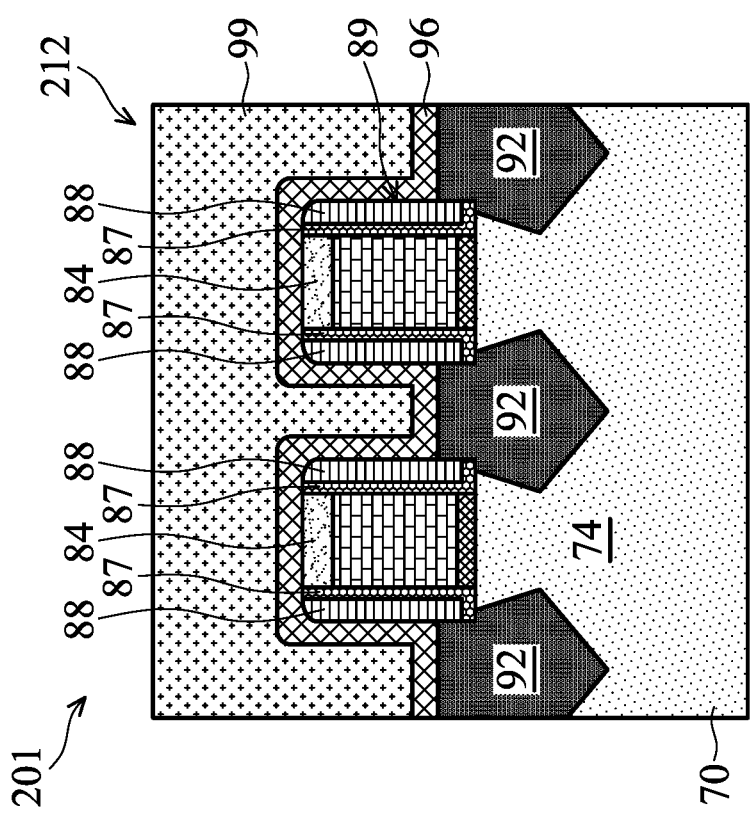
FIG. 14A
FIG. 14B

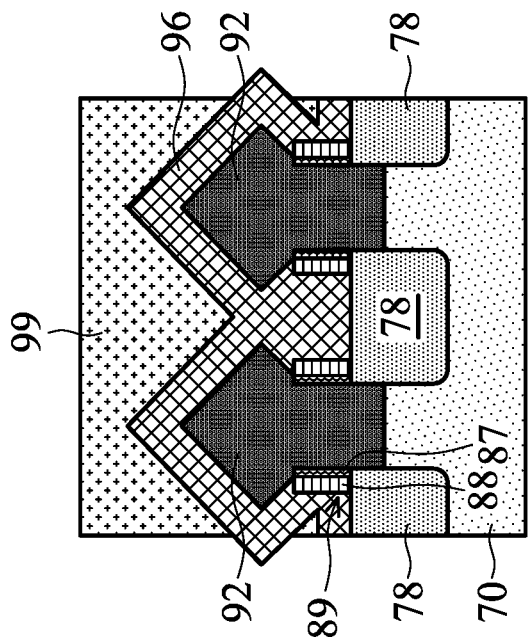
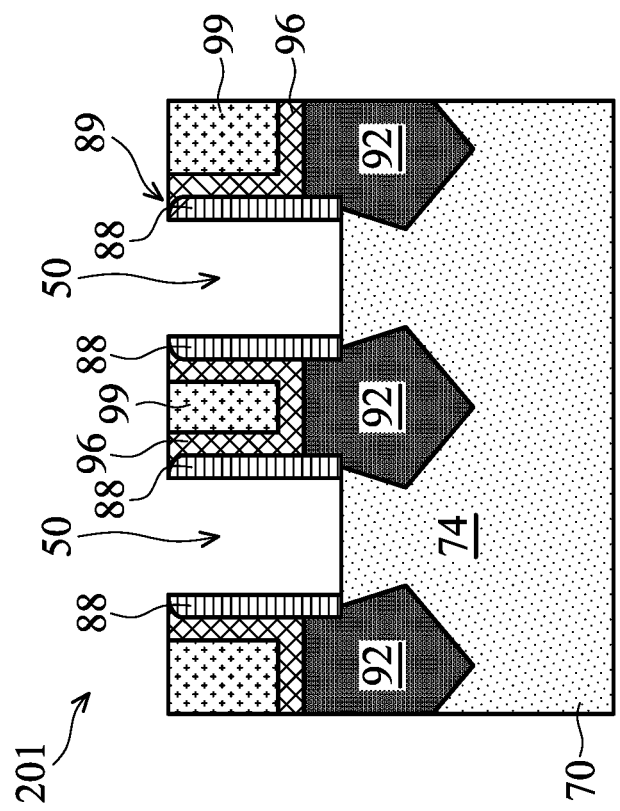
FIG. 15B
FIG. 15A

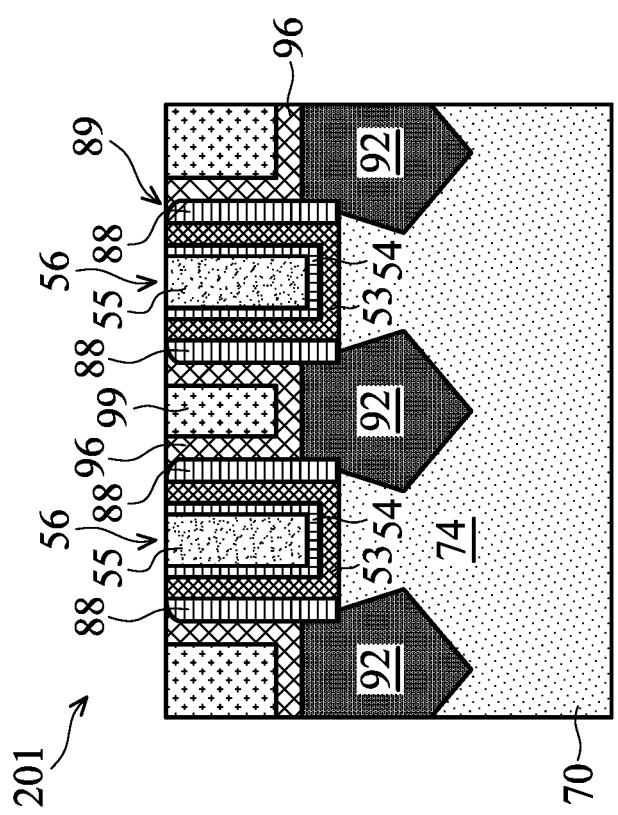
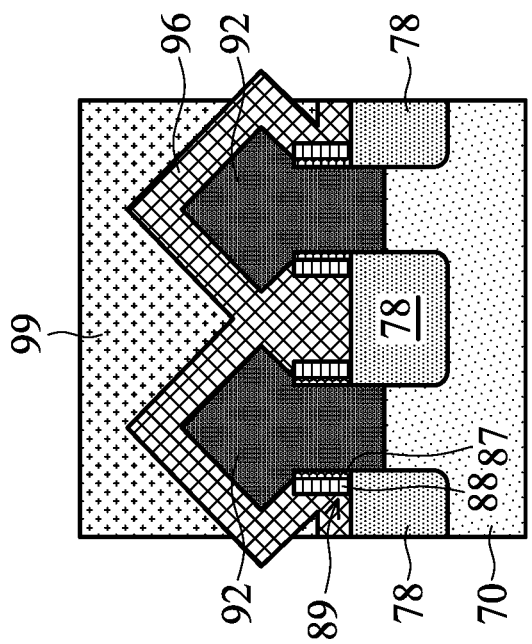
FIG. 16A
FIG. 16B

SPACER STRUCTURE WITH HIGH PLASMA RESISTANCE FOR SEMICONDUCTOR DEVICES

CROSS-REFERENCE TO RELATED APPLICATIONS

This application is a continuation of U.S. patent application Ser. No. 16/575,974 filed Sep. 19, 2019, now U.S. Pat. No. 10,516,036, issued Dec. 24, 2019, which is a continuation of U.S. patent application Ser. No. 15/874,278 filed Jan. 18, 2018, now U.S. Pat. No. 10,483,372, issued Nov. 19, 2019, which claims benefit of U.S. Provisional Application No. 62/565,848 filed Sep. 29, 2017, each is incorporated by reference in its entirety.

BACKGROUND

As the semiconductor industry has progressed into nanometer technology process nodes in pursuit of higher device density, higher performance, and lower costs, challenges from both fabrication and design have resulted in the development of three dimensional designs, such as fin field effect transistors (FinFETs). A typical FinFET is fabricated with a fin structure extending from a substrate, for example, by etching into a silicon layer of the substrate. The channel of the FinFET is formed in the vertical fin. A gate structure is provided over (e.g., overlying to wrap) the fin structure. It is beneficial to have a gate structure on the channel allowing gate control of the channel around the gate structure. FinFET devices provide numerous advantages, including reduced short channel effects and increased current flow.

As the device dimensions continue scaling down, FinFET device performance can be improved by using a metal gate electrode instead of a typical polysilicon gate electrode. One process of forming a metal gate stack is forming a replacement-gate process (also called as a "gate-last" process) in which the final gate stack is fabricated "last". However, there are challenges to implement such IC fabrication processes in advanced process nodes. Inaccurate and improper control of the deposition and patterning process during the gate fabrication may adversely deteriorate electrical performance of the device structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3B, 4A-4B, 5A-5B, 6A-6B, 7A-7B, 8A-8B, 9A-9B, 10A-10B, 11A-11B, 12A-12B, 13A-13B, 14A-14B, 15A-15B and 16A-16B depict cross-sectional views of the semiconductor device structure at different manufacturing stages of FIG. 1 in accordance with some embodiments.

DETAILED DESCRIPTION

Figure 1:
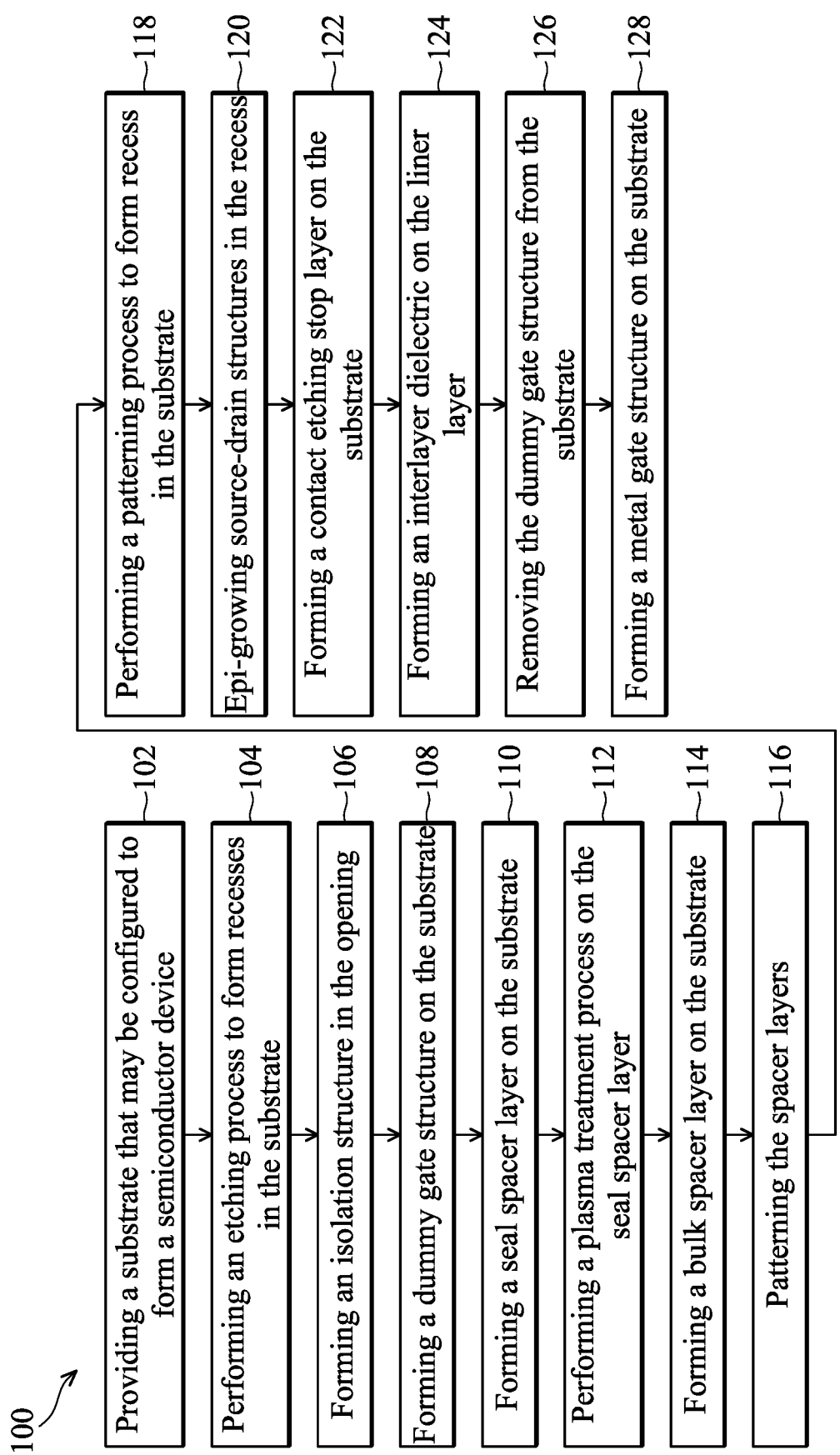
FIG. 1 is a flow chart of an exemplary process for manufacturing a device structure on a substrate in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to replacement gates formed in semiconductor devices. The present disclosure provides methods for manufacturing a spacer structure with good plasma resistance so that the spacer structure may be maintained intact with the desired profile after the replacement gate manufacturing process is completed. In one example, the spacer structure may include multiple spacer layers with different film properties. Implementations of some aspects of the present disclosure may be used in other processes, in other devices, and/or for other layers. For example, other example devices can include planar FETs, Horizontal Gate All Around (HGAA) FETs, Vertical Gate All Around (VGAA) FETs, and other devices. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein.

In a replacement gate process for forming a metal gate for a transistor, a dummy gate stack is formed over a substrate as a placeholder for an actual gate stack later formed thereon. A spacer structure is formed surrounding the dummy gate stack. After source/drain features is formed, a contact etch stop layer (CESL) and interlayer dielectric (ILD) layer are formed adjacent to the spacer structure, the dummy gate stack is removed, leaving an opening surrounded by the spacer structure, CESL and ILD layer. Then, a metal gate is formed in the opening defined by the spacer structure, CESL, and ILD.

The metal gate structure includes a gate dielectric layer, such as a high-k dielectric layer, an optional barrier layer, a work-function tuning layer, and a gate metal electrode. Multiple deposition and patterning processes may be used to form the work-function tuning layer, for example, to fine tune threshold voltage (Vt) of the transistor. In some embodiments, the work-function tuning layer may utilize different materials for different types of transistors, such as p-type FinFET or n-type FinFET, so as to enhance device electrical performance as needed. The barrier layer is optionally used to protect the gate dielectric layer during the patterning processes.

Figure 2:
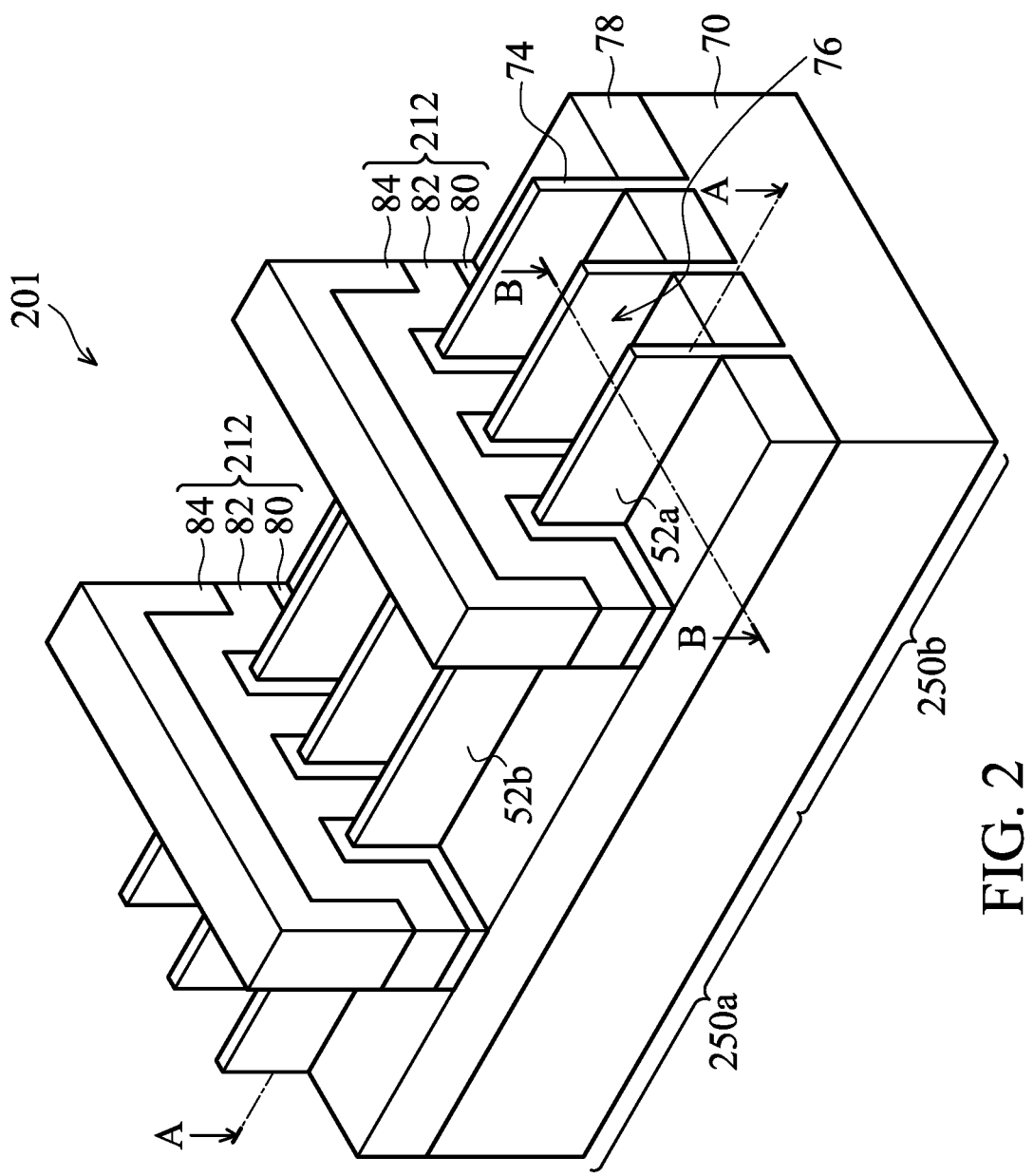
FIG. 2 depicts a perspective view of a semiconductor device structure in accordance with some embodiments.

FIG. 1 depicts an exemplary flow diagram of a process 100 performed to form a semiconductor device structure, such as a simplified FINFET device structure 201 depicted in FIG. 2. Other aspects not illustrated in or described with respect to FIG. 2 may become apparent from the following figures and description. The structure in FIG. 2 may be electrically connected or coupled in a manner to operate as, for example, one transistor or more. FIGS. 3A-16B are schematic cross-sectional views of a portion of the substrate corresponding to various stages of the process 100 in accordance with some embodiments. It is noted that the process 100 may be utilized to form any suitable structures, including the semiconductor device structure 201 depicted in FIGS. 2-16B or other semiconductor structures not presented herein.

The simplified FINFET device structure 201 depicted in FIG. 2 is formed on a substrate 70. The substrate 70 can be or include a bulk semiconductor substrate, a semiconductor-on-insulator (SOI) substrate, or another substrate. The semiconductor material of the substrate 70 can include or be a material selected from at least one of silicon (e.g., crystalline silicon like Si<100> or Si<111>), silicon germanium, germanium, gallium arsenide, or another semiconductor material. The semiconductor material may be doped or undoped, such as with a p-type or an n-type dopant. In some embodiments wherein a SOI structure is utilized for the substrate 70, the substrate 70 may include semiconductor material disposed on an insulator layer, which may be a buried insulator disposed in a semiconductor substrate, or which may be a glass or sapphire substrate. In embodiments depicted herein, the substrate 70 is a silicon containing material, such as a crystalline silicon substrate. Moreover, the substrate 70 is not limited to any particular size, shape, or materials. The substrate 70 may be a round/circular substrate having a 200 mm diameter, a 300 mm diameter, or other diameters, such as 450 mm, among others. The substrate 70 may also be any polygonal, square, rectangular, curved, or otherwise non-circular workpiece, such as a polygonal substrate as needed.

Each fin structure 74 provides an active region where one or more devices are formed. The fin structures 74 are fabricated using suitable processes including masking, photolithography, and/or etch processes. In an example, a mask layer is formed overlying the substrate 70. The photolithography process includes forming a photoresist layer (resist) overlying the mask layer, exposing the photoresist layer to a pattern, performing a post-exposure bake process, and developing the photoresist layer to pattern the photoresist layer. The pattern of the photoresist layer is transferred to the mask layer using a suitable etch process to form a masking element. The masking element may then be used to protect regions of the substrate 70 while an etch process forms recesses 76 into the substrate, leaving an extending fin, such as the fin structures 74. The recesses 76 may be etched using reactive ion etch (RIE) and/or other suitable processes. Numerous other embodiments of methods to form a fin structure on a substrate may be utilized.

In an embodiment, the fin structures 74 are approximately 10 nanometer (nm) wide and in a range from approximately 10 nm to 60 nm in height, such as about 50 nm high. However, it should be understood that other dimensions may be used for the fin structures 74. In one example, the fin structures 74 comprise silicon materials or another elementary semiconductor, such as germanium, or a compound semiconductor including silicon carbide, gallium arsenic, gallium phosphide, indium phosphide, indium arsenide, and/or indium antimonide. The fin structures 74 may also be an alloy semiconductor including SiGe, GaAsP, AlInAs, AlGaAs, GaInAs, GaInP, GaInAsP, or a combination thereof. Further, the fin structures 74 may be doped using n-type and/or p-type dopants as needed.

As described, in an example, the plurality of fin structures 74 may be formed by etching a portion of the substrate 70 away to form recesses 76 in the substrate 70. The recesses 76 may then be filled with isolating material that is recessed or etched back to form isolation structures 78. Other fabrication techniques for the isolation structures 78 and/or the fin structure 74 are possible. The isolation structures 78 may isolate some regions of the substrate 70, e.g., active areas in the fin structures 74. In an example, the isolation structures 78 may be shallow trench isolation (STI) structures and/or other suitable isolation structures. The STI structures may be formed of silicon oxide, silicon nitride, silicon oxynitride, fluoride-doped silicate glass (FSG), a low-k dielectric material, and/or other suitable insulating material. The STI structures may include a multi-layer structure, for example, having one or more liner layers.

A dummy gate structure 212 is formed over the fin structures 74. In the example depicted in FIG. 2, the dummy gate structure 212 includes a gate dielectric layer 80, a gate electrode layer 82, and a hard mask 84. It is noted that the dummy gate structure 212 may further include a capping layer and/or other suitable layers. The various layers in the dummy gate structure 212 may be formed by suitable deposition techniques and patterned by suitable photolithography and etching techniques. The dummy gate structure 212 engages the fin structures 74 on two or three sides of the fin structure 74. Source/drain regions 52a and 52b are disposed in opposing regions of the fin structure 74 with respect to the dummy gate structure 212. As indicated, some source/drain regions may be shared between various transistors, and other source/drain regions that are not illustrated as being shared may be shared with neighboring transistors that are not illustrated, for example. In some examples, various ones of the source/drain regions may be connected or coupled together such that FinFETs are implemented as two functional transistors. For example, if neighboring (e.g., as opposed to opposing) source/drain regions 52a, 52b are electrically connected, such as through coalescing the regions by epitaxial growth (e.g., neighboring source/drain regions, as opposed to on opposing sides of a dummy gate structure 212, being coalesced), two functional transistors may be implemented. Other configurations in other examples may implement other numbers of functional transistors.

The term, "dummy", as described here, refers to a sacrificial structure which will be removed in a later stage and will be replaced with another structure, such as a high-k dielectric and metal gate structure in a replacement gate process. The replacement gate process refers to manufacturing a gate structure at a later stage of the overall gate manufacturing process. The gate dielectric layer 80 can be a dielectric oxide layer. For example, the dielectric oxide layer may be formed by chemical oxidation, thermal oxidation, atomic layer deposition (ALD), chemical vapor deposition (CVD), and/or other suitable methods. The gate electrode layer 82 may be a poly-silicon layer or other suitable layers. For example, the gate electrode layer 82 may be formed by suitable deposition processes such as low-pressure chemical vapor deposition (LPCVD) and plasma-enhanced CVD (PECVD). The hard mask 84 may be any material suitable to pattern the gate electrode layer 82 with desired features/dimensions on the substrate.

In an embodiment, the various layers of the dummy gate structure 212 are first deposited as blanket layers. Then, the blanket layers are patterned through a process including photolithography and etching processes, removing portions of the blanket layers and keeping the remaining portions over the isolation structures 78 and the fin structures 74 to form the dummy gate structure 212.

In an example, the semiconductor device structure 201 includes a p-type device region 250a and an n-type device region 250b. One or more p-type devices, such as p-type FinFETs, may be formed in the p-type device region 250a, and one or more n-type devices, such as n-type FinFETs, may be formed in the n-type device region 250b. The semiconductor device structure 201 may be included in an IC such as a microprocessor, memory device, and/or other IC.

FIG. 2 further illustrates reference cross-sections that are used in later figures. Cross-section A-A is in a plane along, e.g., channels in the fin structure 74 between opposing source/drain regions 52a, 52b. Cross-section B-B is in a plane perpendicular to cross-section A-A and is across source/drain region 52a in fin structure 74. Subsequent figures refer to these reference cross-sections for clarity. The following figures ending with an "A" designation illustrate cross-sectional views at various instances of processing corresponding to cross-section A-A, and the following figures ending with a "B" designation illustrate cross-sectional views at various instances of processing corresponding to cross-section B-B. In some figures, some reference numbers of components or features illustrated therein may be omitted to avoid obscuring other components or features; this is for ease of depicting the figures.

Figure 3B:
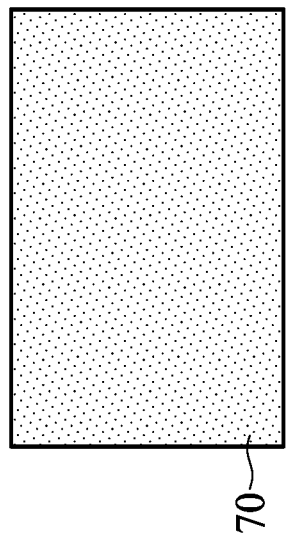
Figure 3A:
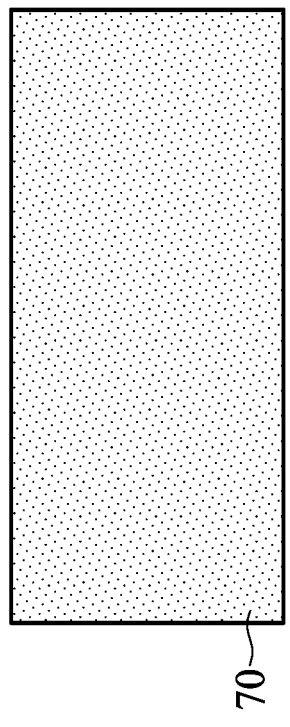

Referring back to the process 100 depicted in FIG. 1, the process 100 begins at operation 102 by providing the substrate 70, as depicted in FIGS. 3A-3B, ready for manufacturing a semiconductor device, such as the semiconductor device 201, to be formed on the substrate 70.

At operation 104, an etching process is performed to form a recess 76 in the substrate 70 defining the fin structures 74 in the substrate 70, as shown in FIGS. 4A-4B. A mask 72 (e.g., a hard mask) is used to facilitate forming the fin structures 74 in the substrate 70. For example, one or more mask layers are deposited over the semiconductor substrate 70, and the one or more mask layers are then patterned into the mask 72. In some examples, the one or more mask layers may include or be silicon nitride, silicon oxynitride, silicon carbide, silicon carbon nitride, the like, or a combination thereof, and may be deposited by chemical vapor deposition (CVD), physical vapor deposition (PVD), atomic layer deposition (ALD), or another deposition technique. The one or more mask layers may be patterned using photolithography. For example, a photo resist can be formed on the one or more mask layers, such as by using spin-on coating, and patterned by exposing the photo resist to light using an appropriate photomask. Exposed or unexposed portions of the photo resist may then be removed depending on whether a positive or negative resist is used. The pattern of the photo resist may then be transferred to the one or more mask layers, such as by using a suitable etch process, which forms the mask 72. The etch process may include a reactive ion etch (RIE), neutral beam etch (NBE), inductive coupled plasma (ICP) etch, the like, or a combination thereof. The etching may be anisotropic. Subsequently, the photo resist is removed in an ashing or wet strip processes, for example.

Figure 5B:
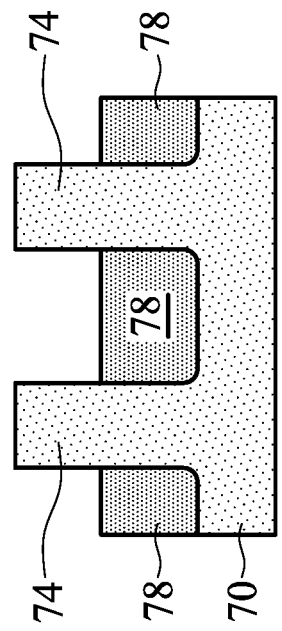
Figure 5A:
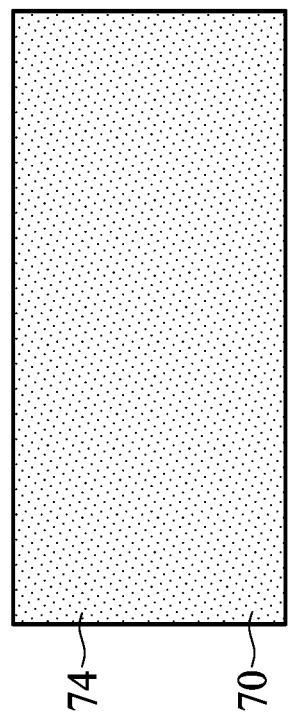

At operation 106, an isolation structure 78 is formed in the recess 76 each in a corresponding recess 76, as shown in FIGS. 5A-5B. The isolation structure 78 may include or be an insulating material such as an oxide (such as silicon oxide), a nitride, the like, or a combination thereof, and the insulating material may be formed by a high density plasma CVD (HDP-CVD), a flowable CVD (FCVD) (e.g., a CVD-based material deposition in a remote plasma system and post curing to make it convert to another material, such as an oxide), the like, or a combination thereof. Other insulating materials formed by any acceptable process may be used. In the illustrated embodiment, the isolation structure 78 includes silicon oxide that is formed by a FCVD process. A planarization process, such as a Chemical Mechanical Polish (CMP), may remove any excess insulating material and any remaining mask (e.g., used to etch the recess 76 and form the fin structures 74) to form top surfaces of the insulating material and top surfaces of the fin structures 74 to be substantially coplanar. The insulating material may then be recessed to form the isolation structure 78. The insulating material is recessed such that the fin structures 74 protrude from between neighboring isolation structures 78, which may, at least in part, thereby delineate the fin structures 74 as active areas on the semiconductor substrate 70. The insulating material may be recessed using an acceptable etch process, such as one that is selective to the material of the insulating material. For example, a chemical oxide removal using a CERTAS® etch or an Applied Materials SICONI tool or dilute hydrofluoric (dHF) acid may be used. Further, top surfaces of the isolation structures 78 may have a flat surface as illustrated, a convex surface, a concave surface (such as dishing), or a combination thereof, which may result from an etch process.

Figure 6A:
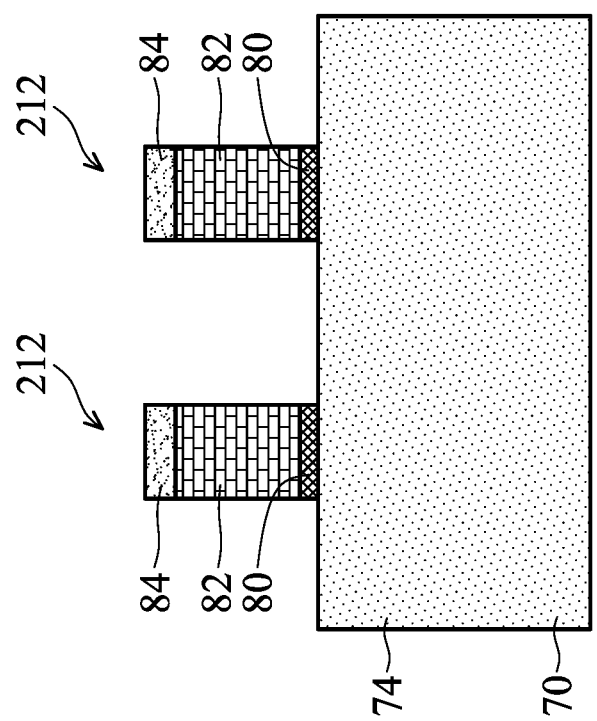
Figure 6B:
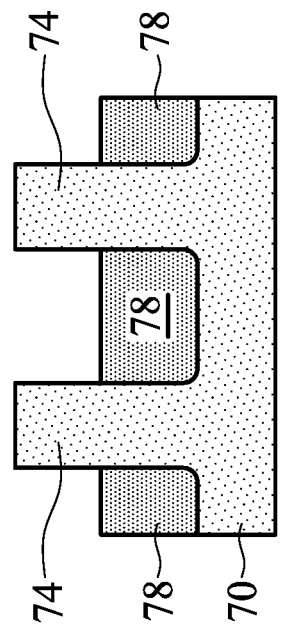

At operation 108, a dummy gate structure 212 is formed on the substrate, as depicted in FIGS. 6A-6B. The dummy gate structure 212 is over and extends laterally perpendicularly to the fin structures 74. Each dummy gate structure 212 comprises a gate dielectric layer 80, a gate electrode layer 82, and a hard mask 84. In a replacement gate process, the gate dielectric layer 80 may be an interfacial dielectric. The gate dielectric layer 80, the gate electrode layer 82 and the hard mask 84 for the dummy gate structure 212 may be formed by sequentially forming respective layers, and then patterning those layers into the dummy gate structure 212. For example, a layer for the interfacial dielectrics may include or be silicon oxide, silicon nitride, the like, or multilayers thereof, and may be thermally and/or chemically grown on the fin structure 74, or conformally deposited, such as by PECVD, ALD, or another deposition technique. A layer for the gate electrode layer 82 may include or be silicon (e.g., polysilicon) or another material deposited by CVD, PVD, or another deposition technique. A layer for the hard mask 84 may include or be silicon nitride, silicon oxynitride, silicon carbon nitride, the like, or a combination thereof, deposited by CVD, PVD, ALD, or another deposition technique. The layers for the hard mask 84, gate electrode layer 82, and the gate dielectric layer 80 may then be patterned, for example, using photolithography and one or more etch processes, like described above, to form the hard mask 84, gate electrode layer 82, and gate dielectric layer 80 for each dummy gate structure 212.

In some embodiments, after forming the dummy gate structure 212, lightly doped drain (LDD) regions (not specifically illustrated) may be formed in the active areas. For example, dopants may be implanted into the active areas (e.g., fin structures 74) using the dummy gate structures 212 as masks. Example dopants can include or be, for example, boron for a p-type device and phosphorus or arsenic for an n-type device, although other dopants may be used. The LDD regions may have a dopant concentration in a range from about $10^{15}$ cm$^{-3}$ to about $10^{17}$ cm$^{-3}$.

At operation 110, a seal spacer layer 86 is formed on sidewalls of the dummy gate structure 212, as shown in FIG. 7A-7B. The seal spacer layer 86 is formed conformally on the substrate 70. In one example, the seal spacer 86 is formed from a material having a dielectric constant less than 4, such as a low-k dielectric material. For example, the seal spacer layer 86 may be fabricated from a material comprising silicon oxycarbide (SiOC) material. In one specific example, the seal spacer layer 86 is fabricated from a nitrogen free silicon oxycarbide (SiOC) material.

In one example, the seal spacer layer 86 may be formed by any suitable deposition process. In one specific example, the seal spacer layer 86 may be formed by an atomic layer deposition (ALD) process. In one example, processing gases used in the ALD process may include a silicon and carbon containing precursor comprising silicon (Si) and carbon (C) sources and an oxygen containing precursor comprising an oxygen source. The silicon (Si) and carbon (C) sources and the oxygen containing precursor may be alternatively supplied during the atomic layer deposition process. In one specific example, the silicon and carbon containing precursor is a nitrogen free silicon and carbon containing precursor. In some examples, the silicon and carbon containing precursor may have a dominant Si—C—Si (silicon-carbon-silicon) linear bonding structure as its specific chemical/functional structure. It is believed that the numbers of the carbon bonded between the silicon bonding may affect the density of the resultant film layer so that the film dielectric constant may be adjusted or altered by controlling the numbers of the carbons formed between the silicon bonding. It is believed that the greater number of the carbon atoms, the lower the dielectric constant of the resultant film layer can be obtained.

Furthermore, the film layers formed dominantly from Si—C—Si linear bonding structure is also believed to have a lower density than the film layers formed dominantly from Si—O—Si, Si—OH, or other silicon containing bonding. Thus, by selecting precursors having Si—C—Si (silicon-carbon-silicon) linear bonding structure as its specific chemical/functional structure, a seal spacer layer 86 with relatively low dielectric constant, e.g., less than 4, such as about 3.0-3.5, may be obtained. Suitable examples of the silicon and carbon containing precursor include SiCl$_3$—CH$_2$—SiCl$_3$, SiCl$_2$—(CH$_2$)$_2$—SiCl$_2$, SiCl—(CH$_2$)$_3$—SiCl, SiCl$_2$=C=SiCl$_2$, and the like. It is noted that the chlorine elements attached to the end of the bonding structure may be considered as a leaving group which will undergo a pyrolysis procedure during the chemical reaction, leaving from the dominate Si—C—Si bonding structure from the precursor to trigger the reaction. Thus, other suitable leaving groups comprising other elements, such as Br, F, or the like, may also be utilized as needed. Suitable examples of the oxygen containing precursor includes water steam (H$_2$O), O$_2$, O$_3$, CO, CO$_2$, and the like.

During the seal spacer layer ALD deposition process at operation 110, different gases including silicon and carbon source precursor and oxygen containing precursor may be alternatively supplied for reaction. The cycles of the ALD process includes alternating flow (or pulse) and purge operations, where each precursor is flowed (or pulsed) and subsequently purged at least once during the cycle. For example, the silicon and carbon source precursor is flowed in an ALD tool chamber into which the substrate (e.g., on which the device structure is formed, e.g., as illustrated in FIGS. 7A-7B) is transferred, and subsequently, the silicon and carbon source precursor is purged from the ALD tool chamber. In some examples, the silicon and carbon source precursor may react with reaction sites available on the substrate before being purged. The reactions may saturate the reaction sites, or the silicon and carbon source precursor may not react with some reaction sites available on the substrate, in some examples. After the silicon and carbon source precursor is purged, the oxygen source precursor is then flowed in the ALD tool chamber, and subsequently, the oxygen source precursor is purged from the ALD tool chamber. Similarly, in some examples, the oxygen source precursor may react with reaction sites available on the substrate before being purged. The reactions may saturate the reaction sites, or the oxygen source precursor may not react with some reaction sites available on the substrate, in some examples.

The cycles of the pulses and the purges between the alternating silicon and carbon source precursor and the oxygen source precursor may be performed any number of times until a desired thickness of the seal spacer layer 86 is formed. The total deposition time may be in a range from 300 seconds to 90 seconds, such as about 600 seconds. The total cycles between the alternating silicon and carbon source precursor and the oxygen source precursor may be in a range from about 15 cycles to 20 cycles, such as about 18 cycles.

In one example, the seal spacer layer 86 may have a dielectric constant from about 3.2 to about 3.7, such as about 3.5.

It is noted that the seal spacer layer 86 described here may be formed as a sacrificial layer and/or surface protection layer to provide an interface protective layer that may prevent the film stack subsequently formed thereon from damage in the following etching/patterning process. Thus, the thickness of the seal spacer layer 86 may be controlled in a range sufficient to provide interface protection. In one example, the seal spacer layer 86 may have a thickness in a range from 10 Å to 50 Å, such as from 20 Å to 35 Å.

Figure 8A:
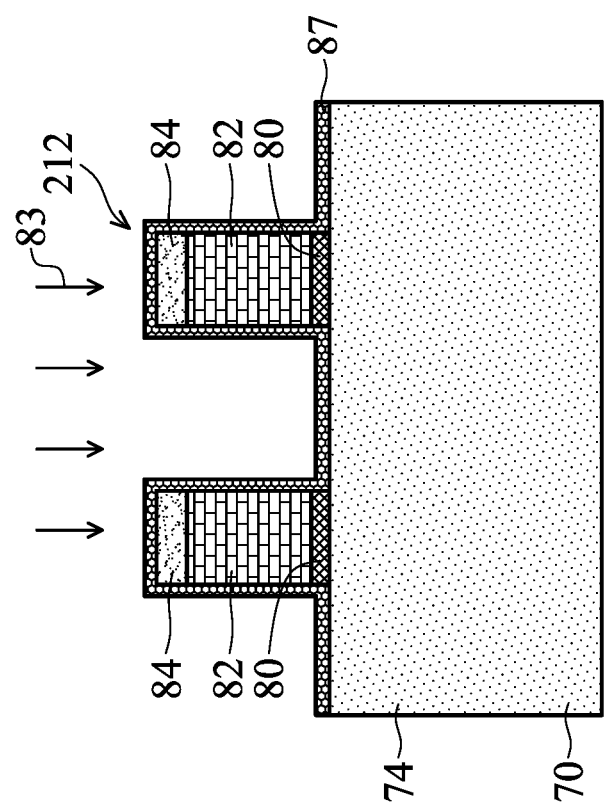
Figure 8B:
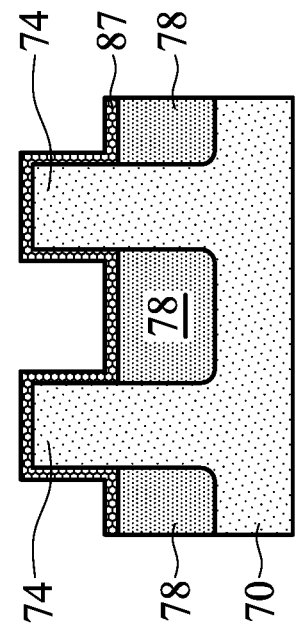

At operation 112, a plasma treatment process is performed on the seal spacer layer 86, as shown in FIGS. 8A-8B. The plasma treatment process treats the seal spacer layer 86 by a plasma 83, as indicated in FIGS. 8A-8B, to alter the substrate surface properties, forming a treated seal spacer layer 87. The plasma surface treatment process may efficiently incorporate certain elements to react with the unsaturated bonds in seal spacer layer 86 so as to improve the bonding energy and densify the film structure to form the treated seal spacer layer 87 with relatively high film density. The higher film density from the treated seal spacer layer 87 may prevent the interface and the film stack subsequently formed thereon from plasma damage during the dummy gate removal process. Furthermore, the treatment process may also be performed to modify the morphology and/or surface roughness of the surface of the seal spacer layer 86 to improve the adhesion and robustness of the of the treated seal spacer layer 87. In one embodiment, the surface treatment process may create a roughened surface having a surface roughness in a range from about 6 Å to about 60 Å.

In one embodiment, the surface treatment process may be performed by supplying a processing gas including a hydrogen containing gas or an inert gas into a plasma processing chamber. The hydrogen containing gas may be selected from the group consisting of H$_2$, H$_2$O, H$_2$O$_2$, combinations thereof and the like. In one example embodiment, the hydrogen containing gas used to perform the substrate treatment process includes H$_2$ gas. Furthermore, in certain embodiments, the processing gas may include an inert gas to perform the surface treatment process. Examples of the inert gas include Ar, He and the like. It is noted that the process parameters used to perform the surface treatment process by using the hydrogen containing gas may be configured to be similar with the process parameters for using the inert gas.

In one example, the plasma treatment process comprises a microwave plasma generated from a microwave generator included in the plasma processing chamber. The microwave generator may generate a microwave power in a range from about 10 Watts to about 3000 Watts at a frequency in a range from about 0.3 GHz to about 300 GHz for the plasma treatment process at operation 112. The plasma process time may be controlled in a range from about 100 seconds to about 1000 seconds, such as about 600 seconds.

As discussed above, the seal spacer layer 86 as utilized here serves as an interface protection layer as well as a sacrificial layer so as to protect the film structures subsequently formed thereon from damage in the following etching/patterning process. The plasma treatment process performed on the seal spacer layer 86 converts the seal spacer layer 86 into treated seal spacer layer 87. The treated spacer layer 86 has a densified and enhanced film structure that provides a robust, plasma resistive and strong interface protection to the device structure. By doing so, the layers subsequently formed thereon may receive good plasma protection in the etching/patterning process.

After the plasma treatment process, the treated seal spacer layer 87 may have a dielectric constant slightly greater than the seal spacer layer 86 due to the higher film density. In one example, the treated seal spacer layer 87 has a dielectric constant in a range from 3.5 and 3.9, such as about 3.7. The film density of the treated seal spacer layer 87 is also greater than the film density of the seal spacer layer 86 due to the densification from the plasma treatment process. In contrast, the thickness of the treated seal spacer layer 87 may be shrunk in a range from about 10% to 20% than the thickness of the seal spacer layer 86. In one example, the treated seal spacer layer 87 has a thickness in a range from about 15 Å to about 28 Å. After the treatment, the film density of the seal spacer layer 86 is changed from 1.7 to 2.5 for the treated seal spacer layer 87.

At operation 114, a bulk spacer layer 88 is then formed on the treated seal spacer layer 87, as shown in FIG. 9A-9B. The bulk spacer layer 88 is substantially the same material as the seal spacer layer 86, as shown in FIGS. 7A-7B, without the plasma treatment process performed thereon. The bulk spacer layer 88 reacts as a main structure of the spacer feature 89 for the semiconductor devices. Thus, sufficient thickness of the bulk spacer layer 88 is implemented to enable the operation of the semiconductor devices. Thus, the thickness of the bulk spacer layer 88 is greater than the thickness of the treated seal spacer layer 87. In one example, the bulk spacer layer 88 may have a thickness in a range from about 50 Å to about 200 Å.

As discussed above, the bulk spacer layer 88 is also formed from a material having a dielectric constant less than 4, such as a low-k dielectric material. For example, the bulk spacer layer 88 may be fabricated from a material comprising silicon oxycarbide (SiOC), as discussed above, with the same material utilized to form the seal spacer layer 86. In one example, the bulk spacer layer 88 is fabricated from a nitrogen free silicon oxycarbide (SiOC) material.

Similarly, the bulk spacer layer 88 may be formed by any suitable deposition process, such as an ALD process. In one specific example, the bulk spacer layer 88 is formed by an atomic layer deposition (ALD) process using a silicon and carbon containing precursor comprising silicon (Si) and carbon (C) sources and an oxygen containing precursor comprising an oxygen source. In one example, the silicon and carbon containing precursor is a nitrogen free silicon and carbon containing precursor. The silicon and carbon containing precursor may have a dominant Si—C—Si (silicon-carbon-silicon) linear bonding structure as its specific chemical structure. Suitable examples of the silicon and carbon containing precursor include SiCl$_3$—CH$_2$—SiCl$_3$, SiCl$_2$—(CH$_2$)$_2$—SiCl$_2$, SiCl—(CH$_2$)$_3$—SiCl, SiCl$_2$=C=SiCl$_2$, and the like. Suitable examples of the oxygen containing precursor includes water steam (H$_2$O), O$_2$, O$_3$, CO, CO$_2$, and the like.

In one example, the bulk spacer layer 88 may have a dielectric constant from about 3.2 to about 3.7, such as about 3.5. The film density of the bulk spacer layer 88 is from about 1.5 to about 2.0, such as about 1.7.

As discussed above, as the bulk spacer layer 88 and the seal spacer layer 86 are formed from the same material, so it can be understood that the treated seal spacer layer 87 may have a dielectric constant slightly greater than the bulk spacer layer 88 due to the higher film density. The film density of the treated seal spacer layer 87 is also greater than the film density of the bulk spacer layer 88 due to the densification from the plasma treatment process.

Figure 10A:
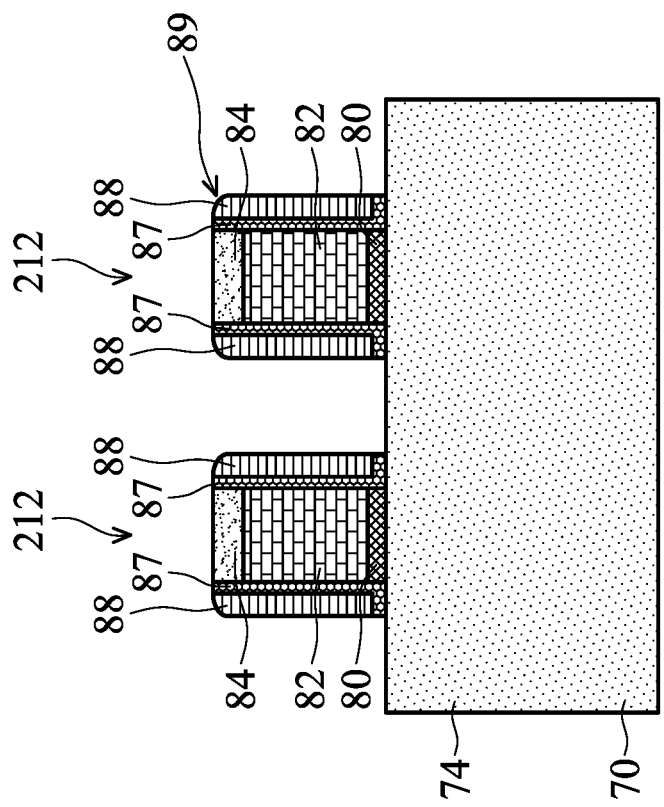
Figure 10B:
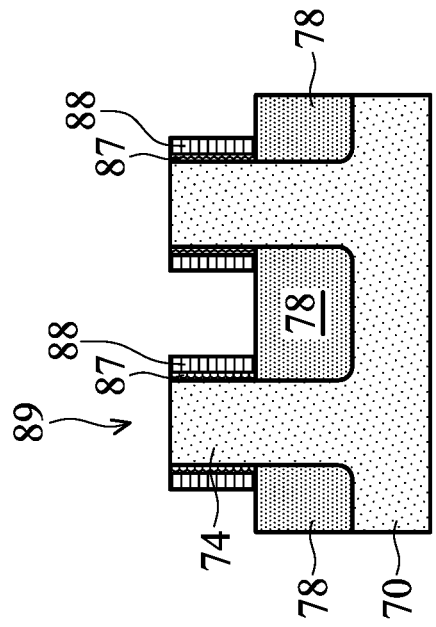

At operation 116, the treated seal spacer layer 87 and the bulk spacer layer 88 are then patterned or anisotropically etched to form a desired profile, forming a spacer feature 89, as shown in FIGS. 10A-10B. The spacer feature 89 includes the treated spacer layer 87 and the bulk spacer layer 88. It is noted that the treated spacer layer 87 may be later sacrificed and removed, leaving only portions of the bulk spacer layer 88 as the spacer feature 89 on the substrate. The etch process can include a RIE, NBE, or another etch process. In an embodiment, the spacer feature 86 includes a dielectric material, such as silicon nitride or silicon oxynitride.

Figure 11B:
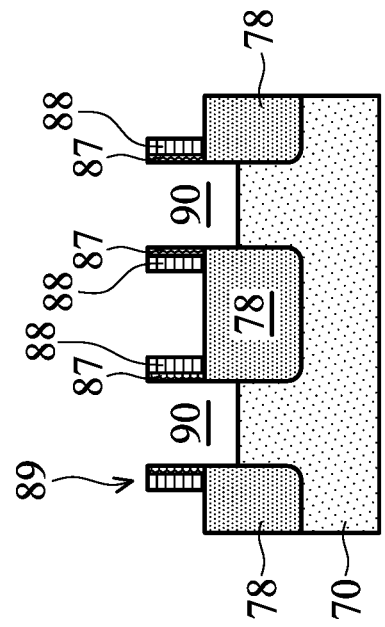
Figure 11A:
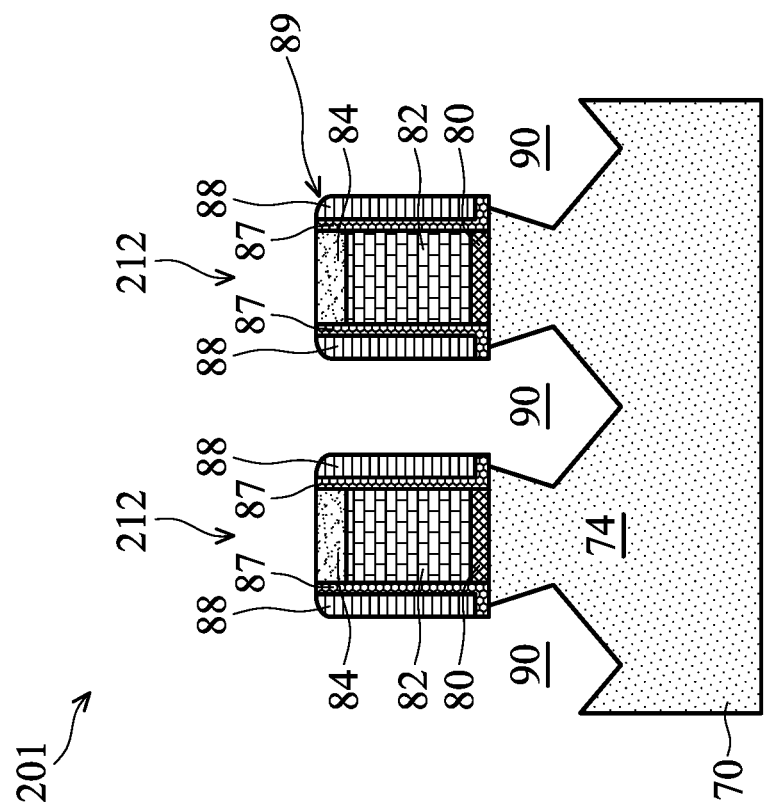

At operation 118, recesses 90 are formed in the substrate 70 for source/drain regions, as shown in FIGS. 11A-11B. As illustrated, the recesses 90 are formed in the fin structure 74 on opposing sides of the dummy gate structure 212. The recessing can be by an etch process. The etch process can be isotropic or anisotropic, or further, may be selective with respect to one or more crystalline planes of the semiconductor substrate 70. Hence, the recesses 90 can have various cross-sectional profiles based on the etch process implemented. The etch process may be a dry etch, such as a RIE, NBE, or the like, or a wet etch, such as using tetramethylammonium hydroxide (TMAH), ammonium hydroxide (NH$_4$OH), or another etchant.

It is noted that the etching process selectively etches the fin structure 74 on the substrate 70 with minimum damage to the spacer feature 89. Thus, when recesses 90 are formed in the substrate 70, as shown in FIG. 11A, at least a portion of the fin structure 74 is removed between the isolation structures 78, as shown in FIG. 11B, and the spacer feature 89 as shown in FIG. 11B may remain on the substrate 70 with minimum height/width loss.

At operation 120, after the recesses 90 are formed in the substrate 70, an epitaxial deposition process may be performed to grow source/drain regions 92, as shown in FIGS. 12A and 12B. The epitaxy source/drain regions 92 may include or be silicon germanium (Si$_x$Ge$_{1-x}$, where x can be between approximately 0 and 100), silicon carbide, silicon phosphorus, pure or substantially pure germanium, a III-V compound semiconductor, a II-VI compound semiconductor, or the like. For example, materials for forming a III-V compound semiconductor include InAs, AlAs, GaAs, InP, GaN, InGaAs, InAlAs, GaSb, AlSb, AlP, GaP, and the like. The epitaxy source/drain regions 92 may be formed in the recesses 90 by epitaxially growing a material in the recesses 90, such as by metal-organic CVD (MOCVD), molecular beam epitaxy (MBE), liquid phase epitaxy (LPE), vapor phase epitaxy (VPE), selective epitaxial growth (SEG), the like, or a combination thereof. As illustrated in FIGS. 12A-12B, due to blocking by the isolation structures 78 and the spacer feature 89, the epitaxy source/drain regions 92 are first grown vertically in recesses 90, during which time the epitaxy source/drain regions 92 do not grow horizontally. After the recesses 90 are fully filled and vertically outward from the spacer feature 89, the epitaxy source/drain regions 92 may grow both vertically and horizontally to form facets, which may correspond to crystalline planes of the semiconductor substrate 70. In some examples, different materials are used for epitaxy source/drain regions for p-type devices and n-type devices. Appropriate masking during the recessing or epitaxial growth may permit different materials to be used in different devices.

A person having ordinary skill in the art will also readily understand that the recessing and epitaxial growth of FIGS. 11A-11B and 12a-12B may be omitted, and that source/drain regions may be formed by implanting dopants into the fin structures 74 using the dummy gate structure 212 and spacer feature 89 as masks. In some examples where epitaxy source/drain regions 92 are implemented, the epitaxy source/drain regions 92 may also be doped, such as by in-situ doping during epitaxial growth and/or by implanting dopants into the epitaxy source/drain regions 92 after epitaxial growth. Example dopants can include or be, for example, boron for a p-type device and phosphorus or arsenic for an n-type device, although other dopants may be used. The epitaxy source/drain regions 92 (or other source/drain region) may have a dopant concentration in a range from about $10^{19}$ cm$^{-3}$ to about $10^{21}$ cm$^{-3}$. Hence, a source/drain region may be delineated by doping (e.g., by implantation and/or in situ during epitaxial growth, if appropriate) and/or by epitaxial growth, if appropriate, which may further delineate the active area in which the source/drain region is delineated.

Figure 13B:
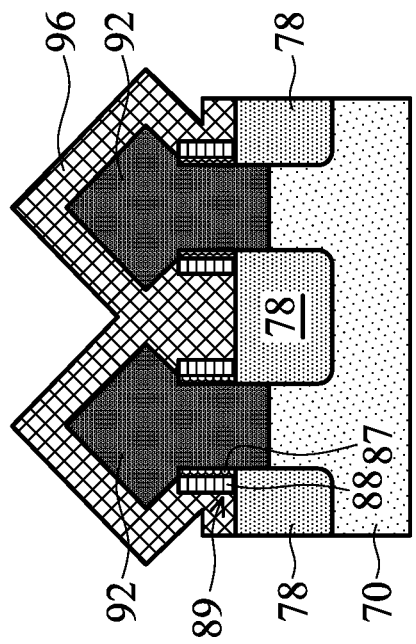
Figure 13A:
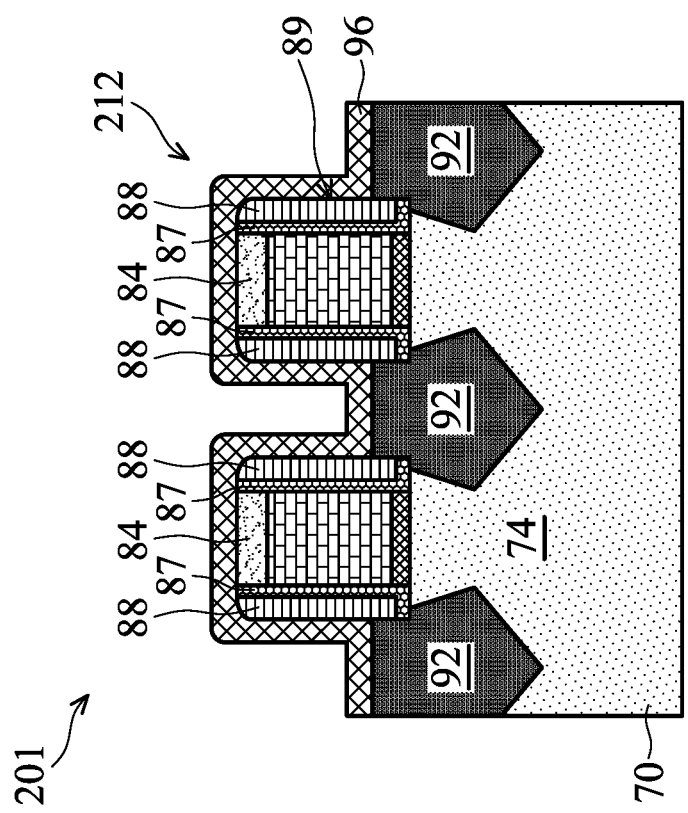

At operation 122, a contact etching stop layer (CESL) 96 is formed covering the dummy gate structure 212, as shown in FIGS. 13A-13B. The CESL 96 can provide a mechanism to stop an etch process when forming, e.g., contacts or vias. The contact etch stop layer 96 may be formed of a dielectric material having a different etch selectivity from adjacent layers or components. The CESL 96 is formed on surfaces of the epitaxy source/drain regions 92, sidewalls and top surfaces of the spacer feature 89, top surfaces of the hard mask 84, and top surfaces of the isolation structures 78. The CESL 96 may comprise or may be a nitrogen containing material, a silicon containing material, and/or a carbon containing material. Furthermore the CESL 96 may comprise or may be silicon nitride, silicon carbon nitride, carbon nitride, silicon oxynitride, silicon carbon oxide, the like, or a combination thereof. The CESL 96 may be deposited by a deposition process, such as a Plasma Enhanced ALD (PEALD), CVD, or another deposition technique.

At operation 124, an ILD layer 99 is formed over the CESL 96, as shown in FIGS. 14A-14B. The ILD layer 99 may include materials such as tetraethylorthosilicate (TEOS) oxide, un-doped silicate glass, doped silicon oxide such as borophosphosilicate glass (BPSG), fused silica glass (FSG), phosphosilicate glass (PSG), boron doped silicon glass (BSG), SiO$_x$C$_y$, Spin-On-Glass, Spin-On-Polymers, silicon carbon material, a compound thereof, a composite thereof, and/or other suitable dielectric materials. The ILD layer 99 may be deposited by a spin-on, CVD, FCVD, PECVD, PVD, or other suitable deposition technique. In an embodiment, the ILD layer 99 is formed by a flowable CVD (FCVD) process to fill between neighboring dummy gate structures 212. It is noted that after the thermal annealing process, the ILD layer 99 may be planarized, such as by a CMP, to provide a planar surface as needed.

At operation 126, subsequently, the dummy gate structure 212 is removed from the substrate 70 to define an opening 50 in the ILD layer 99 as depicted in FIGS. 15A-15B, which may later allow a replacement gate structure 56, such as a metal gate structure, to be formed therein to continue manufacturing the semiconductor device structure 201, as shown in FIGS. 16A-16B. Referring back to FIGS. 15A-15B, during the removal process of dummy gate structure 212, a series of plasma etching/patterning process is performed. In some examples, an ashing process and/or a de-scum process may be performed to remove etching residuals from the substrate 70. Thus, the structures on the substrate 70, including the spacer feature 89, the CESL 96 and the ILD layer 99, can experience plasma attack during the plasma processes, which can result in undesired damage to the film structure, especially to the spacer feature 89, which is in direct contact with the dummy gate structure 212. Thus, by utilizing the spacer feature 89 including the treated seal spacer layer 87 and the bulk spacer layer 88, e.g., multiple spacer layer structure, the treated seal spacer layer 87 serves as an interface protection layer to be in direct exposure to the plasma during the dummy gate structure removal process, thus preventing the bulk spacer layer 88 from exposure to the plasma. Furthermore, as the treated seal spacer layer 87 has a relatively denser film structure and is relatively plasma resistive, the treated seal spacer layer 87 is able to sustain through the aggressive plasma exposure and even through the de-scum oxygen exposure. The oxygen exposure during the de-scum process is often considered a notable factor that may undesirably affect the dielectric constant of the spacer feature 89 as the oxygen elements generated therefrom often brings up the value of the dielectric constant of the spacer feature 89. Thus, the gradual consumption of the treated seal spacer layer 87 allows the bulk spacer layer 88 from being attacked during the aggressive plasma exposure and even during the de-scum oxygen exposure. Thus, the thickness of the treated seal spacer layer 87 is controlled and determined at a proper range that allows the gradual consumption during the aggressive plasma exposure during the dummy gate structure removal process and the de-scum oxygen exposure without early exhaustion, which may undesirably expose the nearby bulk spacer layer 89 to plasma. Thus, in the location depicted in FIG. 15A where the treated spacer layer 87 is in direct contact with the dummy gate structure 212, the treated spacer layer 87 is consumed and substantially removed from the substrate 70 after the dummy gate structure 212 is removed, although, in other examples, at least some portion of the treated spacer layer 87 may remain along the bulk spacer layer 89 in the location where the treated spacer layer 87 was in direct contact with the dummy gate structure 212 after removal of the dummy gate structure 212. In contrast, in the location depicted in FIG. 15B wherein the spacer feature 89, especially the treated seal spacer layer 87, is covered under the CESL 96 and the ILD layer 99 without plasma exposure, the spacer feature 89 including both the treated seal spacer layer 87 and the bulk spacer layer 88 may remain on the substrate 70 lining against the sidewalls of the source/drain regions 92.

At operation 128, after the dummy gate structure 212 is removed, a replacement gate structure 56 may then filled and formed in the opening 50. The replacement gate structure 56 may be a metal gate structure including an interfacial layer (not shown), a high dielectric constant dielectric layer 53, a work function tuning layer 54 and a metal electrode structure 55 formed therein to form a metal gate structure, as shown in FIGS. 16A-16B.

Although not intended to be limiting, one or more embodiments of the present disclosure provide many benefits to a semiconductor device and the formation thereof. For example, embodiments of the present disclosure can provide methods for forming a spacer feature with multiple film layers prior to forming a CESL. The spacer feature may include a seal spacer layer and a bulk spacer layer. The seal spacer layer is plasma treated to form a treated seal spacer which is plasma resistive so as to undergo plasma exposure without early consumption or exhaustion in the subsequent dummy gate removal process. Thus, after the dummy gate structure is removed from the substrate, in some locations, the treated seal spacer along with the bulk spacer layer can remain on the substrate while in some locations, only the bulk spacer layer remains.

In one embodiment, a semiconductor device includes an active area on a substrate, the active area comprising a source/drain region, a gate structure over the active area, the source/drain region being proximate the gate structure, a spacer feature having a first portion along a sidewall of the gate structure and having a second portion along the source/drain region, wherein the first portion of the spacer feature comprises a bulk spacer layer along the sidewall of the gate structure, wherein the second portion of the spacer feature comprises the bulk spacer layer and a treated seal spacer layer, the treated seal spacer layer being disposed along the source/drain region and between the bulk spacer layer and the source/drain region, and a contact etching stop layer on the spacer feature. In an embodiment, an interlayer dielectric layer is on the contact etching stop layer. In an embodiment, the bulk spacer layer has a dielectric constant less than 4. In an embodiment, the bulk spacer layer is a nitrogen free silicon oxycarbide material. In an embodiment, the treated seal spacer layer has a dielectric constant greater than the bulk spacer layer. in an embodiment, the treated seal spacer has a film density greater that the bulk spacer layer. In an embodiment, the gate structure comprises a metal gate electrode disposed on a high dielectric constant layer. In an embodiment, the contact etching stop layer is a silicon nitride containing material. In an embodiment, the bulk spacer layer has a thickness greater than the treated seal spacer layer.

In another embodiment, a method for forming a semiconductor device includes forming a seal spacer layer on a substrate by a first atomic layer deposition process using a first processing gases, plasma treating the seal spacer layer to form a treated seal spacer layer by a second processing gases, wherein the first processing gas is different from the second processing gas, and forming a bulk spacer layer on the seal spacer layer by a second atomic layer deposition process using the first processing gases, and patterning the treated seal spacer layer and the bulk spacer layer into a gate spacer feature along a sidewall of a gate structure. In an embodiment, plasma treating the seal spacer layer further includes forming a plasma in the second processing gases by applying a microwave power to a plasma processing chamber where the substrate is placed. In an embodiment, the first processing gas includes a silicon and carbon containing precursor and an oxygen containing precursor. In an embodiment, the silicon and carbon containing precursor is a nitrogen free silicon and carbon containing precursor. In an embodiment, the oxygen containing precursor comprises water steam. In an embodiment, the silicon and carbon containing precursor has a linear Si—C—Si bonding structure. In an embodiment, the bulk spacer layer has a thickness greater than the treated seal spacer layer. In an embodiment, the second processing gas comprises a hydrogen containing gas, an inert gas, or a combination thereof.

In another embodiment, a method for forming a semiconductor device includes forming a spacer feature comprising a treated seal spacer layer and a bulk spacer layer along a sidewall of a gate structure on a substrate, wherein the gate structure is formed over an active area comprising a source/drain region on the substrate, the source/drain region being proximate the gate structure, and removing the gate structure and at least a portion of the treated seal spacer layer from along the sidewall of the gate structure, wherein the gate structure is removed while maintaining the treated seal spacer layer along the source/drain region. In an embodiment, removing the gate structure and the at least the portion of the treated seal spacer layer from along the sidewall of the gate structure further includes maintaining the bulk spacer layer along the sidewall of the gate structure and along the source/drain region. In an embodiment, the gate structure is a dummy gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device, the method comprising:
    forming a dummy gate on a fin, the fin protruding from a substrate;
    forming a first spacer layer over the dummy gate and the fin, the first spacer layer being a first material having a first density;
    densifying the first spacer layer to form a dense first spacer layer, the dense first spacer layer having a second density, the second density being greater than the first density;
    forming a bulk spacer on the dense first spacer layer, the first spacer layer and the bulk spacer being a same material, wherein the bulk spacer has a lower density than the dense first spacer layer; and
    replacing the dummy gate with a replacement gate, wherein portions of the dense first spacer layer is interposed between the bulk spacer and the fin.

2. The method of claim 1, wherein forming the bulk spacer comprises:
    forming a bulk spacer layer on the dense first spacer layer; and
    anisotropically etching the bulk spacer layer to form the bulk spacer on the dense first spacer layer.

3. The method of claim 2 further comprising:
etching the dense first spacer layer using the bulk spacer as a mask.

4. The method of claim 1, wherein replacing the dummy gate comprises removing at least some of the dense first spacer layer along sidewalls of the bulk spacer.

5. The method of claim 1, wherein the bulk spacer and the dense first spacer layer is a silicon oxycarbide material.

6. The method of claim 5, wherein a density of the bulk spacer is in a range of 1.5 to 2.0, and wherein a density of the dense first spacer layer is 2.5.

7. A method for forming a semiconductor device, comprising:
forming a gate structure on a substrate;
forming a seal spacer layer along a sidewall of the gate structure;
performing a plasma treatment process on the seal spacer layer to form a treated seal spacer layer, the treated seal spacer layer being denser than the seal spacer layer;
forming a bulk spacer layer on the treated seal spacer layer, the bulk spacer layer and the seal spacer layer comprising a same material, the treated seal spacer layer being denser than the bulk spacer layer; and
patterning the treated seal spacer layer and the bulk spacer layer to form a gate spacer feature along a sidewall of the gate structure.

8. The method of claim 7, wherein the plasma treatment process comprises a hydrogen containing process gas.

9. The method of claim 8, wherein the hydrogen containing gas comprises $H_2$, $H_2O$, or $H_2O_2$.

10. The method of claim 7, wherein the plasma treatment process comprises a plasma process using an inert gas.

11. The method of claim 7, wherein a density of the bulk spacer layer is in a range of 1.5 to 2.0.

12. A semiconductor device, comprising:
a fin protruding from a substrate;
isolation regions along opposing sides of the fin;
a gate structure over the fin and the isolation regions; and
a first spacer structure and a second spacer structure on the fin, the gate structure being interposed between the first spacer structure and the second spacer structure, each of the first spacer structure and the second spacer structure comprising a seal spacer and a bulk spacer on the seal spacer, the seal spacer being disposed between the bulk spacer and the fin, wherein the bulk spacer and the seal spacer are a same material, wherein the bulk spacer has a lower dielectric constant than the seal spacer.

13. The semiconductor device of claim 12, wherein a thickness of the bulk spacer is greater than a thickness of the seal spacer.

14. The semiconductor device of claim 12, wherein the seal spacer and the bulk spacer comprise silicon oxycarbide material.

15. The semiconductor device of claim 12, wherein the bulk spacer has a lower density than the seal spacer.

16. The semiconductor device of claim 12, wherein the bulk spacer has a dielectric constant in a range of 3.2 to 3.7.

17. The semiconductor device of claim 12, wherein the bulk spacer is a silicon oxycarbide material.

18. The semiconductor device of claim 12, wherein a density of the bulk spacer is in a range of 1.5 to 2.0.

19. The semiconductor device of claim 18, wherein a density of the seal spacer is 2.5.

20. The semiconductor device of claim 12, wherein the seal spacer completely separates the bulk spacer from the fin.

* * * * *